United States Patent
De Campo et al.

(10) Patent No.: US 10,435,579 B2
(45) Date of Patent: Oct. 8, 2019

(54) COMPOSITIONS CONTAINING HOLE CARRIER MATERIALS AND FLUOROPOLYMERS, AND USES THEREOF

(71) Applicant: NISSAN CHEMICAL INDUSTRIES, LTD., Tokyo (JP)

(72) Inventors: Floryan De Campo, Pittsburgh, PA (US); Robert Swisher, Pittsburgh, PA (US); Elena Sheina, Pittsburgh, PA (US)

(73) Assignee: Nissan Chemical Industries, Ltd., Tokyo (JP)

( * ) Notice: Subject to any disclaimer, the term of this patent is extended or adjusted under 35 U.S.C. 154(b) by 6 days.

(21) Appl. No.: 15/535,355

(22) PCT Filed: Dec. 15, 2015

(86) PCT No.: PCT/US2015/065779
§ 371 (c)(1),
(2) Date: Jun. 12, 2017

(87) PCT Pub. No.: WO2016/100313
PCT Pub. Date: Jun. 23, 2016

(65) Prior Publication Data
US 2017/0369727 A1  Dec. 28, 2017

Related U.S. Application Data

(60) Provisional application No. 62/091,847, filed on Dec. 15, 2014.

(51) Int. Cl.
| | | |
|---|---|---|
| *C09D 11/52* | (2014.01) | |
| *C09D 11/102* | (2014.01) | |
| *C08L 27/16* | (2006.01) | |
| *C09D 11/106* | (2014.01) | |
| *H01L 51/00* | (2006.01) | |

(52) U.S. Cl.
CPC ............. *C09D 11/52* (2013.01); *C08L 27/16* (2013.01); *C09D 11/102* (2013.01); *C09D 11/106* (2013.01); *H01L 51/00* (2013.01); *H01L 51/0005* (2013.01); *H01L 51/0036* (2013.01); *H01L 51/0037* (2013.01); *C08G 2261/1424* (2013.01); *C08G 2261/3223* (2013.01); *C08G 2261/512* (2013.01); *C08G 2261/54* (2013.01); *C08G 2261/792* (2013.01); *C08G 2261/90* (2013.01); *C08G 2261/91* (2013.01); *C08G 2261/92* (2013.01); *C08G 2261/94* (2013.01); *C08G 2261/95* (2013.01); *Y02E 10/549* (2013.01)

(58) Field of Classification Search
None
See application file for complete search history.

(56) References Cited

U.S. PATENT DOCUMENTS

| | | |
|---|---|---|
| 4,356,429 A | 10/1982 | Tang |
| 4,539,507 A | 9/1985 | Vanslyke et al. |
| 5,047,687 A | 9/1991 | Vanslyke et al. |
| 5,247,190 A | 9/1993 | Friend et al. |
| 5,286,413 A | 2/1994 | Hannecart et al. |
| 5,401,827 A | 3/1995 | Holmes et al. |
| 5,454,880 A | 10/1995 | Sariciftci et al. |
| 6,166,172 A | 12/2000 | McCullough et al. |
| 6,602,974 B1 | 8/2003 | McCullough et al. |
| 6,812,399 B2 | 11/2004 | Shaheen et al. |
| 6,933,436 B2 | 8/2005 | Shaheen et al. |
| 7,070,867 B2 | 7/2006 | Thompson et al. |
| 8,674,047 B2 | 3/2014 | Brown et al. |
| 8,865,025 B2 | 10/2014 | Seshadri et al. |
| 2003/0195330 A1 | 10/2003 | Groenendaal et al. |
| 2004/0113127 A1 | 6/2004 | Min et al. |
| 2005/0123793 A1 | 6/2005 | Thompson et al. |
| 2005/0209392 A1 | 9/2005 | Luo et al. |
| 2006/0175582 A1 | 8/2006 | Hammond et al. |
| 2007/0172702 A1 | 7/2007 | Elschner et al. |
| 2009/0230361 A1 | 9/2009 | Seshedri et al. |
| 2010/0108954 A1 | 5/2010 | Benson-Smith et al. |
| 2010/0109000 A1 | 5/2010 | Mathai et al. |
| 2010/0292399 A1 | 11/2010 | Brown et al. |
| 2013/0109813 A1 | 5/2013 | Sheina et al. |
| 2013/0230942 A1 | 9/2013 | Singh et al. |
| 2013/0328026 A1 | 12/2013 | Bhansali et al. |

FOREIGN PATENT DOCUMENTS

| | | |
|---|---|---|
| CN | 103430363 A | 12/2013 |
| JP | 2010-135310 A | 6/2010 |
| WO | WO 2006-086480 | 8/2006 |
| WO | WO 2013/052096 A1 | 4/2013 |

OTHER PUBLICATIONS

Extended European Search Report received in connection with European application No. 15870858.6; dated May 3, 2018.
International Search Report received in connection with international application No. PCT/US2015/065779; dated Mar. 30, 2016.
Kraft et al., "Electroluminescent Conjugated Polymers-Seeing Polymers in a New Light," Angew. Chem. Int. Ed., (1998), 37, 402-428.
Lebedev et al., "Solvato-Controlled Doping of Conducting Polymers", Chem. Mater., (1998) vol. 10, pp. 156-163.
Office Action received in connection with Japanese Patent Application No. 2017-531904, dated Jun. 25, 2019 (with English translation).

*Primary Examiner* — Ana L. Woodward
(74) *Attorney, Agent, or Firm* — The Marbury Law Group, PLLC

(57) ABSTRACT

Described herein are compositions comprising hole carrier materials, typically conjugated polymers, and fluoropolymers ink compositions comprising hole carrier materials and fluoropolymers, and uses thereof, for example, in organic electronic devices.

19 Claims, No Drawings

US 10,435,579 B2

COMPOSITIONS CONTAINING HOLE CARRIER MATERIALS AND FLUOROPOLYMERS, AND USES THEREOF

CROSS REFERENCE TO RELATED APPLICATIONS

This application is a national phase entry of International Application No. PCT/US2015/065779, filed Dec. 15, 2015, which claims the priority of U.S. Provisional Application No. 62/091,847, filed Dec. 15, 2014. The entire contents of the foregoing applications are is explicitly incorporated herein by this reference.

FIELD OF THE INVENTION

The present invention relates to compositions comprising hole carrier materials, typically conjugated polymers, and fluoropolymers, ink compositions comprising hole carrier materials and fluoropolymers, and uses thereof, for example, in organic electronic devices.

BACKGROUND

Although useful advances are being made in energy saving devices such as, for example, organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better materials processing and/or device performance for commercialization. For example, one promising type of material used in organic electronics is the conducting polymers including, for example, polythiophenes. However, problems can arise with polymers' purity, processability, and instability in their neutral and/or conductive states. Also, it is important to have very good control over the solubility of polymers utilized in alternating layers of various devices' architectures (e.g., orthogonal or alternating solubility properties among adjacent layers in particular device architecture). These layers, for example, also known as hole injection layers (HILs) and hole transport layers (HTLs), can present difficult problems in view of competing demands and the need for very thin, but high quality, films.

There is an ongoing unresolved need for a good platform system to control properties of hole injection and transport layers, such as solubility, thermal/chemical stability, and electronic energy levels, such as HOMO and LUMO, so that the materials can be adapted for different applications and to function with different materials, such as light emitting layers, photoactive layers, and electrodes. Good solubility, intractability, and thermal stability properties are important. Also of importance is the ability to tune HIL resistivity and HIL layer thickness while retaining high transparency and low operating voltage. The ability to formulate the system for a particular application and provide the required balance of such properties is also important.

SUMMARY OF THE INVENTION

In a first aspect, the present invention is directed to a composition comprising at least one hole carrier material and at least one fluoropolymer.

In a second aspect, the present invention is directed to an ink composition comprising at least one hole carrier material, at least one fluoropolymer, and a liquid carrier.

In a third aspect, the present invention is directed to a device comprising at least one hole carrier material and at least one fluoropolymer.

An objective of the present invention is to provide tunable HIL resistivity in a device comprising the compositions described herein.

Another objective of the present invention is to provide the ability to tune film thickness and retain high transparency or low absorbance in the visible spectrum (transmittance >90% T) in a device comprising the compositions described herein.

Yet another objective of the present invention is to provide the ability to tune film thickness and retain low operating voltage in a device comprising the compositions described herein.

Still another objective of the present invention is to provide the ability to solution process hole transport layers (HTLs) on top of hole injection layers (HILs) comprising the compositions described herein.

DETAILED DESCRIPTION

As used herein, the terms "a", "an", or "the" means "one or more" or "at least one" unless otherwise stated.

As used herein, the term "comprises" includes "consists essentially of" and "consists of." The term "comprising" includes "consisting essentially of" and "consisting of."

Throughout the present disclosure, various publications may be incorporated by reference. Should the meaning of any language in such publications incorporated by reference conflict with the meaning of the language of the present disclosure, the meaning of the language of the present disclosure shall take precedence, unless otherwise indicated.

As used herein, the terminology "(Cx-Cy)" in reference to an organic group, wherein x and y are each integers, means that the group may contain from x carbon atoms to y carbon atoms per group.

As used herein, the term "alkyl" means a monovalent straight or branched saturated hydrocarbon radical, more typically, a monovalent straight or branched saturated ($C_1$-$C_{40}$)hydrocarbon radical, such as, for example, methyl, ethyl, n-propyl, isopropyl, n-butyl, isobutyl, tert-butyl, hexyl, 2-ethylhexyl, octyl, hexadecyl, octadecyl, eicosyl, behenyl, tricontyl, and tetracontyl.

As used herein, the term "fluoroalkyl" means an alkyl radical as defined herein, more typically a ($C_1$-$C_{40}$) alkyl radical, that is substituted with one or more fluorine atoms. Examples of fluoroalkyl groups include, for example, difluoromethyl, trifluoromethyl, 1H,1H,2H,2H-perfluorooctyl, and perfluoroethyl.

As used herein, the term "aryl" means a monovalent unsaturated hydrocarbon radical containing one or more six-membered carbon rings in which the unsaturation may be represented by three conjugated double bonds. Aryl radicals include monocyclic aryl and polycyclic aryl. Polycyclic aryl refers to a monovalent unsaturated hydrocarbon radical containing more than one six-membered carbon ring in which the unsaturation may be represented by three conjugated double bonds wherein adjacent rings may be linked to each other by one or more bonds or divalent bridging groups or may be fused together. Examples of aryl radicals include, but are not limited to, phenyl, anthracenyl, naphthyl, phenanthrenyl, fluorenyl, and pyrenyl.

Any substituent described herein may optionally be substituted at one or more carbon atoms with one or more, same or different, substituents described herein. For instance, an alkyl group may be further substituted with an aryl group or another alkyl group. Any substituent described herein may optionally be substituted at one or more carbon atoms with one or more substituents selected from the group consisting of halogen, such as, for example, F, Cl, Br, and I; nitro ($NO_2$), cyano (CN), and hydroxy (OH).

As used herein, the term "hole carrier material" refers to any material or compound that is capable of facilitating the movement of holes, i.e., positive charge carriers, and/or blocking the movement of electrons, for example, in an electronic device. Hole carrier materials include materials or compounds useful in layers (HTLs), hole injection layers (HILs) and electron blocking layers (EBLs) of electronic devices, typically organic electronic devices, such as, for example, organic light emitting devices.

The present invention relates to a composition comprising at least one hole carrier material and at least one fluoropolymer.

Hole carrier materials are known in the art and are commercially available. Hole carrier materials may be, for example, low molecular weight materials or high molecular weight materials. Hole carrier materials may be non-polymeric or polymeric. Non-polymeric hole carrier materials include, but are not limited to, cross-linkable and non-crosslinked small molecules. Examples of non-polymeric hole carrier materials include, but are not limited to, N,N'-bis(3-methylphenyl)-N,N'-bis(phenyl)benzidine (CAS #65181-78-4); N,N'-bis(4-methylphenyl)-N,N'-bis(phenyl) benzidine; N,N'-bis(2-naphtalenyl)-N—N'-bis(phenylbenzidine) (CAS #139255-17-1); 1,3,5-tris(3-methyldiphenylamino)benzene (also referred to as m-MTDAB); N,N'-bis(1-naphtalenyl)-N,N'-bis(phenyl)benzidine (CAS #123847-85-8, NPB); 4,4',4"-tris(N,N-phenyl-3-methylphenylamino)triphenylamine (also referred to as m-MTDATA, CAS #124729-98-2); 4,4',N,N'-diphenylcarbazole (also referred to as CBP, CAS #58328-31-7); 1,3,5-tris(diphenylamino)benzene; 1,3,5-tris(2-(9-ethylcarbazyl-3)ethylene)benzene; 1,3,5-tris[(3-methylphenyl)phenylamino]benzene; 1,3-bis(N-carbazolyl)benzene; 1,4-bis (diphenylamino)benzene; 4,4'-bis(N-carbazolyl)-1,1'-biphenyl; 4,4'-bis(N-carbazolyl)-1,1'-biphenyl; 4-(dibenzylamino)benzaldehyde-N,N-diphenylhydrazone; 4-(diethylamino)benzaldehyde diphenylhydrazone; 4-(dimethylamino)benzaldehyde diphenylhydrazone; 4-(diphenylamino)benzaldehyde diphenylhydrazone; 9-ethyl-3-carbazolecarboxaldehyde diphenylhydrazone; copper(II) phthalocyanine; N,N'-bis(3-methylphenyl)-N,N'-diphenyl-benzidine; N,N'-di-[(1-naphthyl)-N,N'-diphenyl]-1,1'-biphenyl)-4,4'-diamine; N,N'-diphenyl-N,N'-di-p-tolylbenzene-1,4-diamine; tetra-N-phenylbenzidine; titanyl phthalocyanine; tri-p-tolylamine; tris(4-carbazol-9-ylphenyl)amine; and tris[4-(diethylamino)phenyl]amine.

In an embodiment, the at least one hole carrier material is polymeric. Polymeric hole carrier materials include, but are not limited to, polymers which comprise hole carrier moieties in the main-chain or side chain, and conjugated polymers, such as, for example, linear conjugated polymers or conjugated polymer brushes. As used herein, "conjugated polymer" refers to any polymer having a backbone comprising a continuous system of $sp^2$-hybridized atoms over which π electrons can delocalize.

In an embodiment, the at least one hole carrier material is a conjugated polymer. Conjugated polymers are known in the art, including their use in organic electronics devices. The conjugated polymers used in the present invention may be homopolymers, copolymers, including block copolymers, such as, for example, A-B diblock copolymers, A-B-A triblock copolymers, and -(AB)$_n$-multiblock copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., the entireties of which are hereby incorporated by reference.

Examples of conjugated polymers include, but are not limited to:

polythiophenes comprising repeating units, such as, for example,

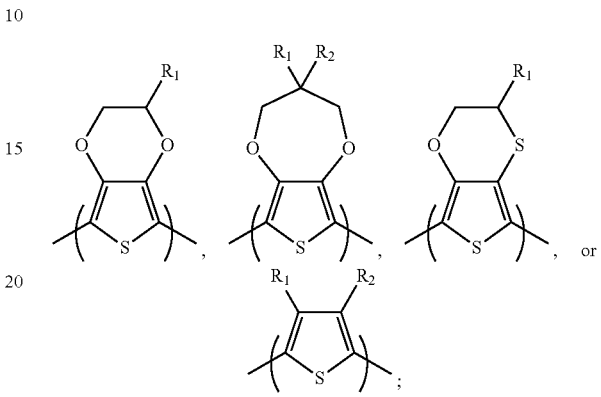

polythienothiophenes comprising repeating units, such as, for example,

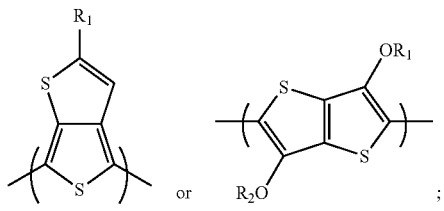

polyselenophenes comprising repeating units, such as, for example, polypyrroles comprising repeating units, such as, for example, polyfurans, polytellurophenes, polyanilines, polyarylamines, and polyarylenes (e.g., polyphenylenes, polyphenylene vinylenes, and polyfluorenes. In the above structures, the groups $R_1$, $R_2$, and $R_3$ can be, independently of each other, optionally substituted $C_1$-$C_{25}$ groups, typically $C_1$-$C_{10}$ groups, more typically $C_1$-$C_8$ groups, including alkyl, fluoroalkyl, alkoxy, and polyether groups. The groups $R_1$ and/or $R_2$ may also be hydrogen (H). The groups can be electron-withdrawing or electron-releasing groups. The side groups can provide solubility. The structures described and illustrated herein can be incorporated into a polymer backbone or side chain.

Additional suitable polymeric hole carrier materials include, but are not limited to, poly[(9,9-dihexylfluorenyl-2,7-diyl)-alt-co-(N,N'bis{p-butylphenyl}-1,4-diaminophenylene)]; poly[(9,9-dioctylfluorenyl-2,7-diyl)-alt-co-(N,N'-bis{p-butylphenyl}-1,1'-biphenylene-4,4'-diamine)]; poly(9,9-dioctylfluorene-co-N-(4-butylphenyl)diphenylamine) (also referred to as TFB) and poly[N,N'-bis(4-butylphenyl)-N,N'-bis(phenyl)-benzidine] (commonly referred to as poly-TPD).

In an embodiment, the conjugated polymer is a polythiophene.

In an embodiment, the polythiophene comprises a repeating unit complying with formula (I)

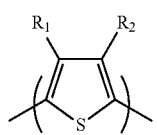

(I)

wherein $R_1$ and $R_2$ are each, independently, H, alkyl, fluoroalkyl, polyether, or alkoxy group.

In an embodiment, $R_1$ and $R_2$ are each, independently, H, fluoroalkyl, —O[C($R_a R_b$)—C($R_c R_d$)—O]$_p$—$R_e$, or —O$R_f$; wherein each occurrence of $R_a$, $R_b$, $R_c$, and $R_d$, are each, independently, H, alkyl, fluoroalkyl, or aryl; $R_e$ is alkyl, fluoroalkyl, or aryl; p is 1, 2, or 3; and $R_f$ is alkyl, fluoroalkyl, or aryl.

In an embodiment, $R_1$ is H and $R_2$ is other than H. In such an embodiment, the repeating unit is derived from a 3-substituted thiophene.

In an embodiment, $R_1$ is H and $R_2$ is —O[C($R_a R_b$)—C($R_c R_d$)—O]$_p$—$R_e$, or —O$R_f$. In an embodiment, $R_1$ is H and $R_2$ is —O[C($R_a R_b$)—C($R_c R_d$)—O]$_p$—$R_e$.

The polythiophene can be a regiorandom or a regioregular material. Due to its asymmetrical structure, the polymerization of 3-substituted thiophenes produces a mixture of polythiophene structures containing three possible regiochemical linkages between repeat units. The three orientations available when two thiophene rings are joined are the 2,2'; 2,5', and 5,5' couplings. The 2,2' (or head-to-head) coupling and the 5,5' (or tail-to-tail) coupling are referred to as regiorandom couplings. In contrast, the 2,5' (or head-to-tail) coupling is referred to as a regioregular coupling. The degree of regioregularity can be, for example, about 0 to 100%, or about 25 to 99.9%, or about 50 to 98%. Regioregularity may be determined by standard methods known to those of ordinary skill in the art, such as, for example, using NMR spectroscopy.

In an embodiment, the polythiophene is regioregular. In some embodiments, the regioregularity of the polythiophene can be at least about 85%, typically at least about 95%, more typically at least about 98%. In some embodiments, the degree of regioregularity can be at least about 70%, typically at least about 80%. In yet other embodiments, the regioregular polythiophene has a degree of regioregularity of at least about 90%, typically a degree of regioregularity of at least about 98%.

3-substituted thiophene monomers, including polymers derived from such monomers, are commercially-available or may be made by methods known to those of ordinary skill in the art. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al.

In another embodiment, $R_1$ and $R_2$ are both other than H. In such an embodiment, the repeating unit is derived from a 3,4-disubstituted thiophene.

In an embodiment, $R_1$ and $R_2$ are each, independently, —O[C($R_a R_b$)—C($R_c R_d$)—O]$_p$—$R_e$, or —O$R_f$. In an embodiment, $R_1$ and $R_2$ are both —O[C($R_a R_b$)—C($R_c R_d$)—O]$_p$—$R_e$. $R_1$ and $R_2$ may be the same or different.

In an embodiment, each occurrence of $R_a$, $R_b$, $R_c$, and $R_d$, are each, independently, H, ($C_1$-$C_8$)alkyl, ($C_1$-$C_8$)fluoroalkyl, or phenyl; and $R_e$ is ($C_1$-$C_8$)alkyl, ($C_1$-$C_8$)fluoroalkyl, or phenyl.

In an embodiment, $R_1$ and $R_2$ are each —O[CH$_2$—CH$_2$—O]$_p$—$R_e$. In an embodiment, $R_1$ and $R_2$ are each —O[CH(CH$_3$)—CH$_2$—O]$_p$—$R_e$.

In an embodiment, $R_e$ is methyl, propyl, or butyl.

In an embodiment, the polythiophene comprises a repeating unit selected from the group consisting of

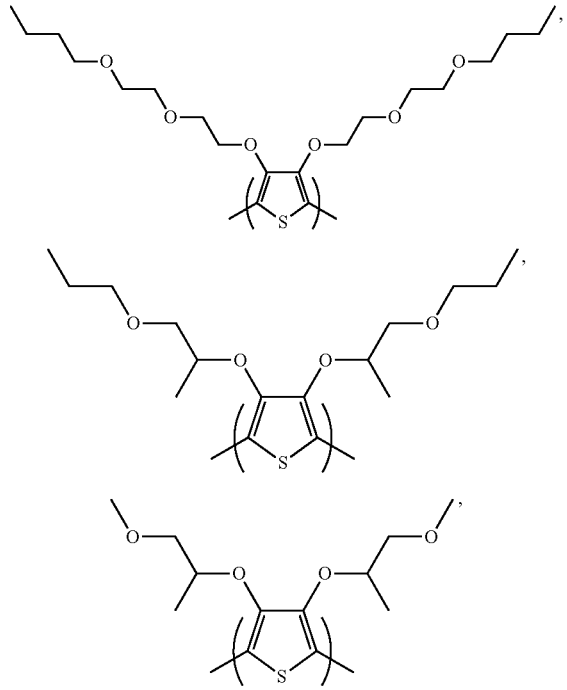

and combinations thereof.

It would be understood by the ordinarily-skilled artisan that the repeating unit

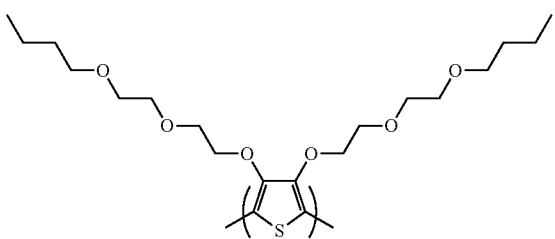

is derived from a monomer represented by the structure

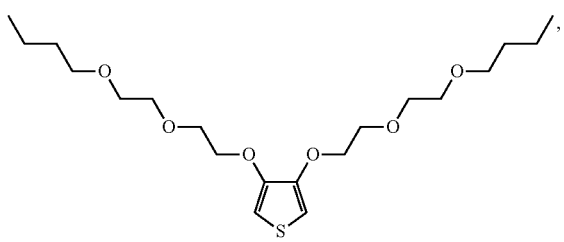 [SMILES: CCCCOCCOCCOc1cscc1OCCOCCOCCCC]

3,4-bis(2-(2-butoxyethoxy)ethoxy)thiophene [referred to herein as 3,4-diBEET];
the repeating unit

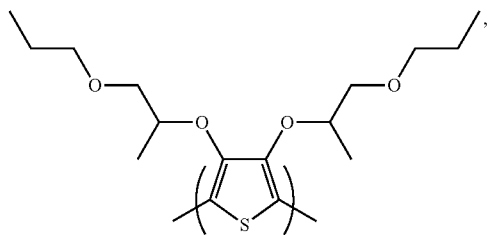

is derived from a monomer represented by the structure

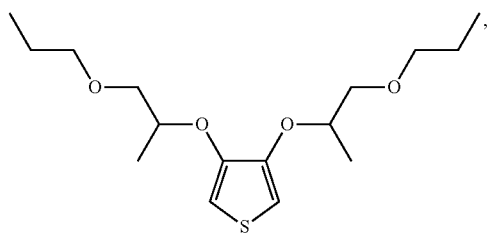 [SMILES: CCCOCC(C)Oc1cscc1OC(C)COCCC]

3,4-bis((1-propoxypropan-2-yl)oxy)thiophene [referred to herein as 3,4-diPPT]; and
the repeating unit

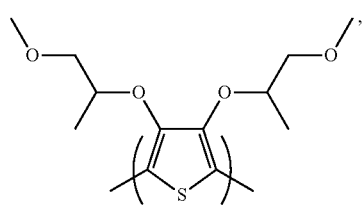

is derived from a monomer represented by the structure

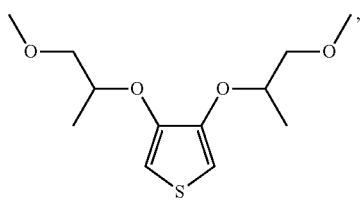

3,4-bis((1-methoxypropan-2-yl)oxy)thiophene [referred to herein as 3,4-diMPT].

3,4-disubstituted thiophene monomers, including polymers derived from such monomers, are commercially-available or may be made by methods known to those of ordinary skill in the art. For example, a 3,4-disubstituted thiophene monomer may be produced by reacting 3,4-dibromothiophene with the metal salt, typically sodium salt, of a compound given by the formula $HO[C(R_aR_b)—C(R_cR_d)—O]_p—R_e$ or $HOR_f$, wherein $R_a$—$R_f$ and p are as defined herein.

The polymerization of 3,4-disubstituted thiophene monomers may be carried out by, first, brominating the 2 and 5 positions of the 3,4-disubstituted thiophene monomer to form the corresponding 2,5-dibromo derivative of the 3,4-disubstituted thiophene monomer. The polymer can then be obtained by GRIM (Grignard methathesis) polymerization of the 2,5-dibromo derivative of the 3,4-disubstituted thiophene in the presence of a nickel catalyst. Such a method is described, for example, in U.S. Pat. No. 8,865,025, the entirety of which is hereby incorporated by reference. Another known method of polymerizing thiophene monomers is by oxidative polymerization using organic non-metal containing oxidants, such as 2,3-dichloro-5,6-dicyano-1,4-benzoquinone (DDQ), or using a transition metal halide, such as, for example, iron(III) chloride, molybdenum(V) chloride, and ruthenium(III) chloride, as oxidizing agent.

Examples of compounds having the formula $HO[C(R_aR_b)—C(R_cR_d)—O]_p—R_e$ or $HOR_f$ that may be converted to the metal salt, typically sodium salt, and used to produce 3,4-disubstituted thiophene monomers include, but are not limited to, ethylene glycol monohexyl ether (hexyl Cellosolve), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

In an embodiment, the conjugated polymer useful in the present invention may be a copolymer, including random copolymer and block copolymer, such as, for example, A-B diblock copolymer, A-B-A triblock copolymer, and -(AB)$_n$-multiblock copolymer. The conjugated polymer may comprise repeating units derived from other types of monomers such as, for example, thienothiophenes, selenophenes, pyrroles, furans, tellurophenes, anilines, arylamines, and arylenes, such as, for example, phenylenes, phenylene vinylenes, and fluorenes.

In an embodiment, the polythiophene comprises repeating units complying with formula (I) in an amount of greater than 70% by weight, typically greater than 80% by weight, more typically greater than 90% by weight, even more typically greater than 95% by weight, of the conjugated polymer.

It would be clear to a person of ordinary skill in the art that, depending on the purity of the starting monomer material(s) used in the polymerization, the polymer formed may contain repeating units derived from impurities. As used herein, the term "homopolymer" is intended to mean a polymer comprising repeating units derived from one type of monomer, but may contain repeating units derived from impurities. In an embodiment, the polythiophene is a homopolymer wherein essentially all of the repeating units are repeating units complying with formula (I).

The conjugated polymer typically has a number average molecular weight between about 1,000 and 1,000,000 g/mol. More typically, the conjugated polymer has a number average molecular weight between about 5,000 and 100,000 g/mol, even more typically about 10,000 to about 50,000 g/mol. Number average molecular weight may be determined according to methods known to those of ordinary skill in the art, such as, for example, by gel permeation chromatography.

Additional hole carrier materials are also described in, for example, US Patent Publications 2010/0292399 published Nov. 18, 2010; 2010/010900 published May 6, 2010; and 2010/0108954 published May 6, 2010.

The at least one hole carrier material, typically a conjugated polymer, may be doped or undoped.

In an embodiment, the at least one hole carrier material is doped with a dopant. Dopants are known in the art. See, for example, U.S. Pat. No. 7,070,867; US Publication 2005/0123793; and US Publication 2004/0113127. The dopant can be an ionic compound. The dopant can comprise a cation and an anion. One or more dopants may be used to dope the at least one hole transport material.

The cation of the ionic compound can be, for example, V, Cr, Mn, Fe, Co, Ni, Cu, Nb, Mo, Tc, Ru, Rh, Pd, Ag, Ta, W, Re, Os, Ir, Pt, or Au.

The cation of the ionic compound can be, for example, gold, molybdenum, rhenium, iron, and silver cation.

In some embodiments, the dopant can comprise a sulfonate or a carboxylate, including alkyl, aryl, and heteroaryl sulfonates and carboxylates. As used herein, "sulfonate" refers to a —$SO_3M$ group, wherein M may be $H^+$ or an alkali metal ion, such as, for example, $Na^+$, $Li^+$, $K^+$, $Rb^+$, $Cs^+$, or ammonium ($NH_4^+$). As used herein, "carboxylate" refers to a —$CO_2M$ group, wherein M may be $H^+$ or an alkali metal ion, such as, for example, $Na^+$, $Li^+$, $K^+$, $Rb^+$, $Cs^+$, or ammonium ($NH_4^+$). Examples of sulfonate and carboxylate dopants include, but are not limited to, benzoate compounds, heptafluorobutyrate, methanesulfonate, trifluoromethanesulfonate, p-toluenesulfonate, pentafluoropropionate, and polymeric sulfonates, such as, for example, poly(styrenesulfonic) acid (PSS), perfluorosulfonate-containing ionomers, and the like.

In some embodiments, the dopant does not comprise a sulfonate or a carboxylate.

In some embodiments, dopants can comprise sulfonylimides, such as, for example, bis(trifluoromethanesulfonyl) imide; antimonates, such as, for example, hexafluoroantimonate; arsenates, such as, for example, hexafluoroarsenate; phosphorus compounds, such as, for example, hexafluorophosphate; and borates, such as, for example, tetrafluoroborate, tetraarylborates, and trifluoroborates. Examples of tetraarylborates include, but are not limited to, halogenatedtetraarylborates, such as tetrakispentafluorophenylborate (TPFB). Examples of trifluoroborates include, but are not limited to, (2-nitrophenyl)trifluoroborate, benzofurazan-5-trifluoroborate, pyrimidine-5-trifluoroborate, pyridine-3-trifluoroborate, and 2,5-dimethylthiophene-3-trifluoroborate.

In an embodiment, the dopant comprises a tetraarylborate.

In one embodiment the dopant may be a silver salt comprising a tetraarylborate, typically a halogenatedtetraarylborate.

In an embodiment, the dopant comprises tetrakis(pentafluorophenyl)borate (TPFB).

In an embodiment, the dopant is silver tetrakis(pentafluorophenyl)borate, represented by the structure

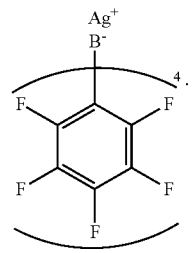

The dopant may be obtained commercially or synthesized using techniques known to those of ordinary skill in the art. For example, a silver salt comprising a tetraarylborate, such as AgTPFB, may be obtained, for example, via a metathesis reaction carried out with a water soluble silver salt and a tetraarylborate salt. For example, the reaction can be represented by:

$M_1X_1 + M_2X_2 \rightarrow M_1X_2(\text{insoluble}) + M_2X_1(\text{soluble})$

The precipitation of $M_1X_2$ can facilitate, for at least some cases, driving the reaction to the right to produce relatively high yields. $M_1$ can be a metal, such as, for example, silver, and $M_2$ can be a metal, such as, for example, lithium. $X_1$ can provide water solubility, such as, for example, nitrate. $X_2$ can be a non-coordinating anion, such as tetraarylborate. $M_1X_2$ can be insoluble in water, and $M_2X_1$ can be soluble in water.

For example, AgTPFB can be prepared by a metathesis of lithium tetrakis(pentafluorophenyl)borate (LiTPFB) and silver nitrate by dissolving in acetonitrile followed by precipitation in water. Such a method is described, for example, in U.S. Pat. No. 8,674,047, the entirety of which is hereby incorporated by reference.

As disclosed herein, the hole carrier material, typically a conjugated polymer, can be doped with a dopant. A dopant can be, for example, a material that will undergo one or more electron transfer reaction(s) with, for example, a conjugated polymer, thereby yielding a doped hole carrier material, typically a doped conjugated polymer. The dopant can be selected to provide a suitable charge balancing counteranion. A reaction can occur upon mixing of the conjugated polymer and the dopant as known in the art. For example, the dopant may undergo spontaneous electron transfer from the polymer to a cation-anion dopant, such as a metal salt, leaving behind a conjugated polymer in its oxidized form with an associated anion and free metal. See, for example, Lebedev et al., Chem. Mater., 1998, 10, 156-163. As disclosed herein, the conjugated polymer and the dopant can refer to components that will react to form a doped conjugated polymer. The doping reaction can be a charge transfer reaction, wherein charge carriers are generated, and the reaction can be reversible or irreversible. In some embodiments, silver ions may undergo electron transfer to or from silver metal and the conjugated polymer.

In the final formulation, the composition can be distinctly different from the combination of original components (i.e., conjugated polymer and/or dopant may or may not be present in the final composition in the same form before mixing).

Some embodiments allow for removal of reaction byproducts from the doping process. For example, the metals, such as silver, can be removed by filtrations.

Materials can be purified to remove, for example, halogens and metals. Halogens include, for example, chloride, bromide and iodide. Metals include, for example, the cation of the dopant, including the reduced form of the cation of the dopant, or metals left from catalyst or initiator residues. Metals include, for example, silver, nickel, and magnesium. The amounts can be less than, for example, 100 ppm, or less than 10 ppm, or less than 1 ppm.

Metal content, including silver content, can be measured by ICP-MS, particularly for concentrations greater than 50 ppm.

Unreacted dopant can be also present or removed, including unreacted cation, including unreacted silver ion.

In an embodiment, when the at least one hole carrier material, typically a conjugated polymer, is doped with a dopant, the conjugated polymer and the dopant is mixed to form a doped conjugated polymer composition. Mixing may be achieved using any method known to those of ordinary skill in the art. For example, a solution comprising the conjugated polymer may be mixed with a separate solution comprising the dopant. The solvent or solvents used to dissolve the conjugated polymer and the dopant may be one or more solvents described herein. A reaction can occur upon mixing of the conjugated polymer and the dopant as known in the art. The resulting doped conjugated polymer composition comprises between about 40% and 75% by weight of the conjugated polymer and between about 25% and 55% by weight of the dopant, based on the composition. In another embodiment, the doped conjugated polymer composition comprises between about 50% and 65% for the conjugated polymer and between about 35% and 50% of the dopant, based on the composition. Typically, the amount by weight of the conjugated polymer is greater than the amount by weight of the dopant. The conjugated polymer can be any conjugated polymer as described above. Typically, the repeating unit is 3-substituted thiophene (as in a 3-substituted polythiophene) or a 3,4-disubstituted thiophene (as in a 3,4-disubstituted polythiophene). Typically, the dopant can be a silver salt, such as silver tetrakis(pentafluorophenyl)borate in an amount of about 0.25 to 0.5 m/ru, wherein m is the molar amount of silver salt and ru is the molar amount of conjugated polymer repeat unit.

The doped conjugated polymer is isolated according to methods known to those of ordinary skill in the art, such as, for example, by rotary evaporation of the solvent, to obtain a dry or substantially dry material, such as a powder. The amount of residual solvent can be, for example, 10 wt. % or less, or 5 wt. % or less, or 1 wt. % or less, based on the dry or substantially dry material. The dry or substantially dry powder can be redispersed or redissolved in one or more new solvents.

The fluoropolymer suitable for use according to the present invention may be a partially fluorinated polymer or a perfluorinated polymer. The fluoropolymer may be a homopolymer or a copolymer. Blends of fluoropolymers comprising two or more homopolymers and/or copolymers may also be used according to the present invention.

In an embodiment, the fluoropolymer is a partially fluorinated polymer.

In another embodiment, the fluoropolymer is a partially fluorinated polymer comprising repeating units derived from vinylidene fluoride monomers (also referred to as vinylidene difluoride or VF2). Such a partially fluorinated polymer comprising repeating units derived from VF2 is commonly referred to as poly(vinylidene fluoride), or PVDF. The PVDF used according to the present invention includes PVDF homopolymer and PVDF copolymer, such as, for example, random copolymers and block copolymers.

In an embodiment, the fluoropolymer is a PVDF copolymer.

Examples of PVDF copolymer include, but are not limited to, copolymers of vinylidene fluoride with at least one monomer selected from the group consisting of trifluoroethylene, tetrafluoroethylene, pentafluoropropene, 3,3,3-trifluoropropene, hexafluoropropylene, and chlorotrifluoroethylene.

In an embodiment, the fluoropolymer is PVDF-hexafluoropropylene (PVDF-HPF) copolymer.

In an embodiment, the PVDF copolymer comprises repeating units derived from vinylidene fluoride in an amount of greater than 70% by weight, typically greater than 80% by weight, more typically greater than 90% by weight, of the copolymer.

The fluoropolymer may or may not comprise —OM, —SO$_3$M, and/or —CO$_2$M, wherein M may be H$^+$ or an alkali metal ion, such as, for example, Na$^+$, Li$^+$, K$^+$, Rb$^+$, Cs$^+$, or ammonium (NH$_4^+$). The fluoropolymer may or may not comprise sulfonimide, phosphonic acid, and/or phosphoric acid groups.

In an embodiment, the fluoropolymer does not comprise —OM, —SO$_3$M, and/or —CO$_2$M.

In an embodiment, the fluoropolymer does not comprise sulfonimide, phosphonic acid, and/or phosphoric acid groups.

In an embodiment, the fluoropolymer is PVDF homopolymer.

The fluoropolymers suitable for use according to the present invention are commercially available. For example, PVDF copolymers and homopolymers are available from Solvay (sold under the tradenames Solef® and Hylar®). The fluoropolymers may also be produced according to methods known to those of ordinary skill in the art, such as, for example, by radical polymerization, including suspension polymerization and/or emulsion polymerization, of the desired monomers described herein. Synthesis of PVDF copolymers and homopolymers is described, for example, in Ameduri, Chem. Rev. (2009), 109, pp. 6632-6686, which is herein incorporated by reference in its entirety.

In the composition comprising at least one hole carrier material and at least one fluoropolymer according to the present invention, the ratio of hole carrier material-to-fluoropolymer (hole carrier material:fluoropolymer ratio), by weight, can be from 10:1 to 1:10, typically from 2:1 to 1:6, more typically from 1:1 to 1:4.

The composition comprising at least one hole carrier material and at least one fluoropolymer may further comprise one or more optional matrix materials known to be useful in hole injection layers (HILs) or hole transport layers (HTLs).

The matrix material can be a lower or higher molecular weight material, and is different from the conjugated polymer and/or fluoropolymer described herein. The matrix material can be, for example, a synthetic polymer that is different from the conjugated polymer and/or the fluoropolymer. See, for example, US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may also be a semi-crystalline or crystalline polymer that has a glass transition temperature equal to or lower than 25° C. and a melting point greater than 25° C. The synthetic polymer may comprise acidic groups.

The matrix material can be a planarizing agent. A matrix material or a planarizing agent may be comprised of, for example, a polymer or oligomer such as an organic polymer, such as poly(styrene) or poly(styrene) derivatives; poly (vinyl acetate) or derivatives thereof; poly(ethylene glycol) or derivatives thereof; poly(ethylene-co-vinyl acetate); poly (pyrrolidone) or derivatives thereof (e.g., poly(1-vinylpyrrolidone-co-vinyl acetate)); poly(vinyl pyridine) or derivatives thereof; poly(methyl methacrylate) or derivatives thereof; poly(butyl acrylate); poly(aryl ether ketones); poly (aryl sulfones); poly(aryl ether sulfones); poly(esters) or derivatives thereof; or combinations thereof.

The matrix material or a planarizing agent may be comprised of, for example, at least one semiconducting matrix component. The semiconducting matrix component is different from the conjugated polymer and/or fluoropolymer described herein. The semiconducting matrix component can be a semiconducting small molecule or a semiconducting polymer that is typically comprised of repeat units comprising hole carrying units in the main-chain and/or in a side-chain. The semiconducting matrix component may be in the neutral form or may be doped, and is typically soluble in organic solvents, such as toluene, chloroform, acetonitrile, cyclohexanone, anisole, chlorobenzene, o-dichlorobenzene, ethyl benzoate and mixtures thereof.

The amount of the optional matrix material can be controlled and measured as a weight percentage relative to the amount of the hole carrier material and the optional dopant combined. For example, the amount can be from 0 to 99.5 wt. %, typically from about 10 wt. to about 98 wt. %, more typically from about 20 wt. % to about 95 wt. %. In the embodiment with 0 wt. %, the composition does not further comprise a matrix material.

In an embodiment, the composition comprising at least one hole carrier material and at least one fluoropolymer further comprises at least one matrix material.

The present invention also relates to an ink composition comprising at least one hole carrier material, at least one fluoropolymer, and a liquid carrier.

The liquid carrier used in the ink composition according to the present invention may comprise a solvent or a solvent blend comprising two or more solvents adapted for use and processing with other layers in a device such as the anode or light emitting layer. The liquid carrier may be aqueous or non-aqueous.

Various solvents or blends of solvents can be used as the liquid carrier. Organic solvents, such as aprotic solvents, may be used. Use of aprotic non-polar solvents can provide, in at least some examples, the additional benefit of increased life-times of devices with emitter technologies which are sensitive to protons. Examples of such devices include PHOLEDs.

Other solvents suitable for use in the liquid carrier include, but are not limited to, aliphatic and aromatic ketones, tetrahydrofuran (THF), tetrahydropyran (THP), chloroform, alkylated benzenes, halogenated benzenes, N-methylpyrrolidinone (NMP), dimethylformamide (DMF), dimethylacetamide (DMAc), dimethyl sulfoxide (DMSO), dichloromethane, acetonitrile, dioxanes, ethyl acetate, ethyl benzoate, methyl benzoate, dimethyl carbonate, ethylene carbonate, propylene carbonate, 3-methoxypropionitrile, 3-ethoxypropionitrile, or combinations thereof. The conjugated polymer and/or the fluoropolymer are typically highly soluble and highly processable in these solvents.

Aliphatic and aromatic ketones include, but are not limited to, acetone, acetonyl acetone, methyl ethyl ketone (MEK), methyl isobutyl ketone, methyl isobutenyl ketone, 2-hexanone, 2-pentanone, acetophenone, ethyl phenyl ketone, cyclohexanone, cyclopentanone. In some embodiments, these solvents are avoided. In some embodiments, ketones with protons on the carbon located alpha to the ketone are avoided, such as cyclohexanone, methyl ethyl ketone, and acetone.

Other solvents might also be considered, that solubilize the conjugated polymer, that swell the conjugated polymer, or that even act as non-solvents for the conjugated polymer. Such other solvents may be included in the liquid carrier in varying quantities to modify ink properties such as wetting, viscosity, morphology control.

Solvents to be considered may include ethers such as anisole, ethoxybenzene, dimethoxy benzenes and glycol ethers, such as, ethylene glycol diethers, such as 1,2-dimethoxy ethane, 1,2-diethoxy ethane, and 1,2-dibutoxy ethane; diethylene glycol diethers such as diethylene glycol dimethyl ether, and diethylene glycol diethyl ether; propylene glycol diethers such as propylene glycol dimethyl ether, propylene glycol diethyl ether, and propylene glycol dibutyl ether; dipropylene glycol diethers, such as dipropylene glycol dimethyl ether, dipropylene glycol diethyl ether, and dipropylene glycol dibutyl ether; as well as higher analogues (i.e., tri- and tetra-analogues) of the ethylene glycol and propylene glycol ethers mentioned herein.

Still other solvents can be considered, such as ethylene glycol monoether acetates and propylene glycol monoether acetates, wherein the ether can be selected, for example, from methyl, ethyl, n-propyl, iso-propyl, n-butyl, sec-butyl, tert-butyl, and cyclohexyl. Also, higher glycol ether analogues of above list such as di-, tri- and tetra-. Examples include, but are not limited to, propylene glycol methyl ether acetate, 2-ethoxyethyl acetate, 2-butoxyethyl acetate.

As disclosed herein, the one or more solvents can be used in varying proportions in the liquid carrier, for example, to improve the ink characteristics such as substrate wettability, ease of solvent removal, viscosity, surface tension, and jettability.

The amount of solids content in the ink composition according to the present invention is from about 0.1 wt. % to about 10 wt. %, typically from about 0.3 wt. % to about 10 wt. %, more typically from about 0.5 wt. % to about 5 wt. %.

The amount of liquid carrier in the ink composition according to the present invention is from about 90 wt. % to about 99 wt. %, typically from about 90 wt. % to about 95 wt. %.

The ink composition comprising at least one hole carrier material, typically a conjugated polymer, at least one fluoropolymer, and liquid carrier according to the present invention can be cast and annealed as a film on a substrate optionally containing an electrode or additional layers used to improve electronic properties of a final device. The resulting films may be intractable to one or more organic solvents, which can be the solvent or solvents used as liquid carrier in the ink for subsequently coated or deposited layers during fabrication of a device. The films may be intractable to, for example, toluene, which can be the solvent in the ink for subsequently coated or deposited layers during fabrication of a device.

The present invention also relates to a device comprising at least one hole carrier material and at least one fluoropolymer. The devices described herein can be made by methods known in the art including, for example, solution processing. Inks can be applied and solvents removed by standard methods.

Methods are known in the art and can be used to fabricate organic electronic devices including, for example, OLED and OPV devices. Methods known in the art can be used to measure brightness, efficiency, and lifetimes. Organic light emitting diodes (OLED) are described, for example, in U.S. Pat. Nos. 4,356,429 and 4,539,507 (Kodak). Conducting polymers which emit light are described, for example, in U.S. Pat. Nos. 5,247,190 and 5,401,827 (Cambridge Display Technologies). Device architecture, physical principles, solution processing, multilayering, blends, and materials synthesis and formulation are described in Kraft et al., "Electroluminescent Conjugated Polymers—Seeing Polymers in a New Light," Angew. Chem. Int. Ed., 1998, 37, 402-428, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g., AlQ3 and the like), and even Aldrich, such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) poly(p-phenylene) and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes, such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers, such as poly(p-phenylene-2,6-benzobisthiazole), poly(p-phenylene-2,6-benzobisoxazole), poly(p-phenylene-2,6-benzimidazole), and their derivatives;

(xv) polyfluorene polymers and co-polymers with polyfluorene units.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis(2-methyl-8-hydroxyquinolinato) aluminum; (v) bis(hydroxybenzoquinolinato) beryllium (BeQ.sub.2); (vi) bis(diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687.

The devices can be fabricated in many cases using multilayered structures which can be prepared by, for example, solution or vacuum processing, as well as printing and patterning processes. In particular, use of the embodiments described herein for hole injection layers (HILs), wherein the composition is formulated for use as a hole injection layer, can be carried out effectively.

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV;
3) Channel material in transistors;
4) Channel material in circuits comprising a combination of transistors, such as logic gates;
5) Electrode material in transistors;
6) Gate layer in a capacitor;
7) Chemical sensor where modification of doping level is achieved due to association of the species to be sensed with the conductive polymer;
8) Electrode or electrolyte material in batteries.

A variety of photoactive layers can be used in OPV devices. Photovoltaic devices can be prepared with photoactive layers comprising fullerene derivatives mixed with, for example, conducting polymers as described in, for example, U.S. Pat. Nos. 5,454,880; 6,812,399; and 6,933,436. Photoactive layers may comprise blends of conducting polymers, blends of conducting polymers and semiconducting nanoparticles, and bilayers of small molecules such as pthalocyanines, fullerenes, and porphyrins.

Common electrode materials and substrates, as well as encapsulating materials can be used.

In one embodiment, the cathode comprises Au, Ca, Al, Ag, or combinations thereof. In one embodiment, the anode comprises indium tin oxide. In one embodiment, the light emission layer comprises at least one organic compound.

Interfacial modification layers, such as, for example, interlayers, and optical spacer layers may be used. In an embodiment, the interlayer does not comprise a fluoropolymer.

Electron transport layers can be used.

The present invention also relates to a method of making a device described herein.

In an embodiment, the method of making a device comprises: providing a substrate; layering a transparent conductor, such as, for example, indium tin oxide, on the substrate; providing the ink composition described herein; layering the ink composition on the transparent conductor to form a hole injection layer or hole transport layer; layering an active layer on the hole injection layer or hole transport layer (HTL); and layering a cathode on the active layer.

The substrate can be flexible or rigid, organic or inorganic. Suitable substrate materials include, for example, glass, ceramic, metal, and plastic films.

In another embodiment, a method of making a device comprises applying the ink composition as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

The layering of the ink composition to form the HIL or HTL layer can be carried out by methods known in the art including, for example, spin casting, spin coating, dip casting, dip coating, slot-dye coating, ink jet printing, gravure coating, doctor blading, and any other methods known in the art for fabrication of, for example, organic electronic devices.

In one embodiment, the HIL layer is thermally annealed. In one embodiment, the HIL layer is thermally annealed at temperature of about 25° C. to about 250° C., typically 150° C. to about 200° C. In one embodiment, the HIL layer is thermally annealed at temperature of of about 25° C. to about 250° C., typically 150° C. to about 200° C., for about 5 to about 40 minutes, typically for about 15 to about 30 minutes. In one embodiment, the HIL layer is heated to remove the liquid carrier.

Transmission of light is important, and good transmission at higher film thicknesses is particularly important. For example, an HIL or HTL can be prepared that can exhibit a transmittance (typically, with a substrate) of at least about 85%, typically at least about 90%, of light having a wavelength of about 400-800 nm. In an embodiment, the transmittance is at least about 90%.

In one embodiment, the HIL layer has a thickness of from about 5 nm to about 500 nm, typically from about 5 nm to about 150 nm, more typically from about 50 nm to 120 nm.

In an embodiment, the HIL layer exhibits a transmittance of at least about 90% and has a thickness of from about 5 nm to about 500 nm, typically from about 5 nm to about 150 nm, more typically from about 50 nm to 120 nm. In an embodiment, the HIL layer exhibits a transmittance (% T) of at least about 90% and has a thickness of from about 50 nm to 120 nm.

The present invention is further illustrated by the following non-limiting examples.

Example 1. Preparation of Doped Conjugated Polymer

Doped conjugated polymers were prepared according to the following general procedure. The preparation of the doped conjugated polymer was carried out in an inert atmosphere glove box. A solution of conjugated polymer was prepared by dissolving an amount of the desired conjugated polymer in one or more solvents. Next, a dopant solution was prepared by adding an amount of silver tetrakis (pentafluorophenyl)borate dopant to another solvent or solvents, which may be the same or different from the solvent or solvents used to dissolve the conjugated polymer, and stirring until dissolved. Some amount of silver powder (Aldrich Cat. #327093) was added to the dopant solution with stirring, and then the solution of conjugated polymer was added to the dopant solution. Stirring was continued for about 2 to about 66 hours then the solution was filtered through a 0.45 micron PTFE filter. The solvent was then removed to isolate the doped conductive polymer.

An illustrative example of the general preparation of doped conjugated polymers is the preparation of doped poly[3,4-bis(2-(2-butoxyethoxy)ethoxy)thiophene] (poly[3,4-diBEET]). A solution of conjugated polymer was prepared by dissolving 2.64 g of poly[3,4-bis(2-(2-butoxyethoxy)ethoxy)thiophene] in 349 g of anhydrous dichloromethane. Next, a dopant solution was prepared by adding 1.71 g of silver tetrakis(pentafluorophenyl)borate dopant to 226 g of anhydrous dichloromethane and stirring until dissolved. At which point, 10.5 g of silver powder was added to the dopant solution with stirring, and then the solution of conjugated polymer was added to the dopant solution. Stirring was continued for 66 hours then the solution was filtered through a 0.45 micron PTFE filter. Dichloromethane was then removed by rotary evaporation to isolate 3.93 g of tetrakis (pentafluorophenyl)borate-doped poly[3,4-bis(2-(2-butoxyethoxy)ethoxy)thiophene].

Additional examples of doped conjugated polymers were prepared using the general procedure described herein. The materials and quantities used in preparing the doped conjugated polymers are summarized in Table 1.

TABLE 1

| Ex. | Conjugated polymer | Conjugated polymer weight (g) | Weight of solvent for conjugated polymer (g) | Dopant weight (g) | Weight of solvent for dopant (g) |
|---|---|---|---|---|---|
| 1.1 | poly[3,4-diBEET] | 2.64 | 349 | 1.71 | 226 |
| 1.2 | poly[3,4-diMPT] | 2.17 | 287 | 2.19 | 289 |
| 1.3 | poly[3,4-diPPT] | 4.59 | 148 | 3.81 | 123 |

Example 2. Ink Compositions

HIL ink compositions were prepared according to the following general procedure under inert atmosphere unless otherwise indicated. An amount of the doped conjugated polymer prepared in Example 1 was dissolved in one or more anhydrous solvents. A second solution was prepared by dissolving an amount of fluoropolymer in one or more solvents. The fluoropolymer solution was then added to the doped conjugated polymer solution with stirring to form the ink composition.

For instance, 175 mg of the doped conjugated polymer of Example 1.3 was dissolved in 6.83 g of a blend of anisole and 3-methoxypropionitrile (2:1 by weight). A second solution was prepared by dissolving 175 mg of Solef® 6008 PVDF homopolymer in 6.83 g of anhydrous NMP. The Solef solution was added to the doped conjugated polymer solution with stirring.

Examples of the inventive HIL ink compositions according to the general procedure, including the materials and amounts used, are summarized in Table 2 as Examples 2.1-2.13. Comparative examples 2.14 and 2.15 are included in Table 2. As used in Table 2, AN/PCN refers to anisole/3-methoxypropionitrile blend (2:1 by weight), NMP refers to N-methylpyrrolidinone, MB/PCN refers to methyl benzoate/3-methoxypropionitrile blend (2:1 by weight), DMF refers to dimethylformamide.

TABLE 2

| Ex. | Doped conjugated polymer | Doped conjugated polymer weight | Solvent for doped conjugated polymer | Solvent weight for doped conjugated polymer (g) | Fluoropolymer* | Fluoropolymer weight | Solvent for fluoropolymer | Solvent weight for fluoropolymer (g) |
|---|---|---|---|---|---|---|---|---|
| 2.1 | 1.3 | 175 mg | AN/PCN | 6.83 | Solef® 6008 | 175 mg | NMP | 6.83 |
| 2.2 | 1.3 | 175 mg | AN/PCN | 6.83 | Solef® 21508 | 175 mg | NMP | 6.83 |
| 2.3 | 1.2 | 70 mg | AN/PCN | 2.73 | Solef® 6008 | 280 mg | NMP | 10.92 |
| 2.4 | 1.3 | 0.438 g | NMP | 17.1 | Solef® 21508 | 0.438 g | NMP | 17.1 |
| 2.5 | 1.3 | 0.300 g | NMP | 14.6 | Solef® 21508 | 0.450 g | NMP | 14.6 |
| 2.6 | 1.3 | 0.500 g | NMP | 7.8 | Solef® 21508 | 2.00 g | NMP | 7.8 |
| 2.7 | 1.3 | 150 mg | DMF | 5.85 | Solef® 21508 | 150 mg | DMF | 5.85 |
| 2.8 | 1.1 | 175 mg | MB/PCN | 8.58 | Solef® 6020 | 175 mg | NMP | 8.58 |
| 2.9 | 1.3 | 0.438 g | AN/PCN | 17.1 | Solef® 21216 | 0.438 | NMP | 17.1 |
| 2.10 | 1.3 | 0.438 g | AN/PCN | 17.1 | Solef® 21510 | 0.438 | NMP | 17.1 |
| 2.11 | 1.2 | 140 mg | AN/PCN | 5.46 | Solef® 21510 | 210 mg | NMP | 8.19 |
| 2.12 | 1.1 | 150 mg | AN/PCN | 5.85 | Solef® 6008 | 150 mg | NMP | 5.85 |
| 2.13 | 1.1 | 188 mg | AN/PCN | 7.31 | Solef® 21508 | 188 mg | NMP | 7.31 |
| 2.14 | 1.1 | 350 mg | MB/PCN | 13.65 | None | n/a | n/a | n/a |
| 2.15 | 1.2 | 254 mg | AN/PCN | 9.91 | None | n/a | n/a | n/a |

*Solef® 6008 and 6020 are tradenames for PVDF homopolymer (sold by Solvay); Solef® 21508, 21216 and 21510 are tradenames for PVDF-HFP copolymer (sold by Solvay)

Example 3. Unipolar Device Fabrication

The unipolar, single charge-carrier devices described herein were fabricated on indium tin oxide (ITO) surfaces deposited on glass substrates. The ITO surface was pre-patterned to define the pixel area of 0.05 cm². Before depositing an HIL ink composition on the substrates, pre-conditioning of the substrates was performed. The device substrates were first cleaned by ultrasonication in various solutions or solvents. The device substrates were ultrasonicated in a dilute soap solution, followed by distilled water, then acetone, and then isopropanol, each for about 20 minutes. The substrates were dried under nitrogen flow. Subsequently, the device substrates were then transferred to a vacuum oven set at 120° C. and kept under partial vacuum (with nitrogen purging) until ready for use. The device substrates were treated in a UV-Ozone chamber operating at 300 W for 20 minutes immediately prior to use.

Before the HIL ink composition is deposited onto an ITO surface, filtering of the ink composition through a PTFE 0.45-μm filter is performed.

The HIL was formed on the device substrate by spin coating. Generally, the thickness of the HIL after spin-coating onto the ITO-patterned substrates is determined by several parameters such as spin speed, spin time, substrate size, quality of the substrate surface, and the design of the spin-coater. General rules for obtaining certain layer thickness are known to those of ordinary skill in the art. After spin-coating, the HIL layer was dried on a hot plate, typically at a temperature of from 150° C. to 200° C. for 15-30 minutes.

All steps in the coating and drying process are done under an inert atmosphere.

The coating thickness was measured by a profilometer (Veeco Instruments, Model Dektak 8000) and reported as the average of three readings. Film transparency, given as percent transmission, was measured by a UV-visible-NIR spectrophotometer (Cary 5000) relative to the uncoated substrate, which is assigned to equal 100%.

The film properties of several inventive HIL layers formed from the inventive HIL ink compositions of Example 2 are summarized in Table 3. Comparison examples 3.5 and 3.6 are included.

TABLE 3

| Ex. | Ink | Fluoropolymer weight % in film | Film thickness, nm | % Transmittance @ 550 nm |
|---|---|---|---|---|
| 3.1 | 2.4 | 50 | 109 | 90 |
| 3.2 | 2.5 | 60 | 110 | 91 |
| 3.3 | 2.6 | 80 | 119 | 94 |
| 3.4 | 2.8 | 60 | 70 | 95 |
| 3.5 | 2.14 | 0 | 110 | 85 |
| 3.6 | 2.15 | 0 | 116 | 84 |

The substrates comprising the inventive HIL layers were then transferred to a vacuum chamber where the remaining layers of the device stack were deposited, for example, by means of physical vapor deposition.

N,N'-bis(1-naphtalenyl)-N,N'-bis(phenyl)benzidine (NPB) was deposited as a hole transport layer on top of the HIL followed by a gold (Au) or aluminum (Al) cathode. This is a unipolar device wherein the hole-only injection efficiency of the HIL into the HTL is studied.

Example 4. Unipolar Device Testing

The unipolar device comprises pixels on a glass substrate whose electrodes extended outside the encapsulated area of the device which contain the light emitting portion of the pixels. The typical area of each pixel is 0.05 cm². The electrodes were contacted with a current source meter such as a Keithley 2400 source meter with a bias applied to the ITO electrode while the gold or aluminum electrode was earthed. This results in only positively charged carriers (holes) being injected into the device (hole-only device). In this example, the HIL assists the injection of charge carriers into the hole transporting layer. This results in a low operating voltage of the device (defined as the voltage required running a given current density through the pixel).

The typical device stack, including target film thickness, for the unipolar device, is ITO (220 nm)/HIL (100 nm)/NPB (150 nm)/Al (100 nm). The properties of unipolar devices comprising the inventive HILs are summarized in Table 4. Comparative examples 4.4 and 4.5 are included.

TABLE 4

| Ex. | Ink used | Fluoropolymer weight % in film | Target film thickness, nm | Voltage @ 10 mA/cm² current density |
|---|---|---|---|---|
| 4.1 | 2.4 | 50 | 100 | 3.4 |
| 4.2 | 2.5 | 60 | 100 | 2.1 |
| 4.3 | 2.6 | 80 | 100 | 3.3 |
| 4.4 | 2.14 | 0 | 20 | 2.2 |
| 4.5 | 2.15 | 0 | 20 | 2.2 |

What is claimed is:

1. An organic light emitting diode (OLED) device comprising a composition comprising:
   (a) at least one hole carrier material, and
   (b) at least one fluoropolymer which is a partially fluorinated homopolymer or copolymer comprising repeating units derived from vinylidene fluoride monomer,
   wherein the device comprises a hole injection layer or a hole transport layer which comprises the composition comprising: (a) at least one hole carrier material, and (b) at least one fluoropolymer which is a partially fluorinated homopolymer or copolymer comprising repeating units derived from vinylidene fluoride monomer.

2. The device according to claim 1, wherein the at least one hole carrier material is a polythiophene.

3. The device according to claim 2, wherein the polythiophene comprises a repeating unit complying with formula (I)

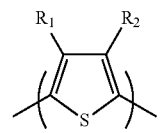

(I)

wherein $R_1$ and $R_2$ are each, independently, H, fluoroalkyl, —O[C($R_a R_b$)—C($R_c R_d$)—O]$_p$—$R_e$, or —O$R_f$; wherein each occurrence of $R_a$, $R_b$, $R_c$, and $R_d$, are each, independently, H, alkyl, fluoroalkyl, or aryl; $R_e$ is alkyl, fluoroalkyl, or aryl; p is 1, 2, or 3; and $R_f$ is alkyl, fluoroalkyl, or aryl.

4. The device according to claim 3, wherein $R_1$ is H and $R_2$ is other than H or wherein $R_1$ and $R_2$ are both other than H.

5. The device according to claim 3, wherein $R_1$ is H and $R_2$ is —O[C($R_a R_b$)—C($R_c R_d$)—O]$_p$—$R_e$ or wherein $R_1$ and $R_2$ are both —O[C($R_a R_b$)—C($R_c R_d$)—O]$_p$—$R_e$.

6. The device according to claim 3, wherein $R_1$ and $R_2$ are each —O[CH$_2$—CH$_2$—O]$_p$—$R_e$ or wherein $R_1$ and $R_2$ are each —O[CH(CH$_3$)—CH$_2$—O]$_p$—$R_e$.

7. The device according to claim 3, wherein $R_e$ is methyl, propyl, or butyl.

8. The device according to claim 2, wherein the polythiophene is regioregular.

9. The device according to claim 8, wherein the degree of regioregularity is about 25 to 99.9%.

10. The device according to claim 2, wherein the polythiophene comprises a repeating unit selected from the group consisting of

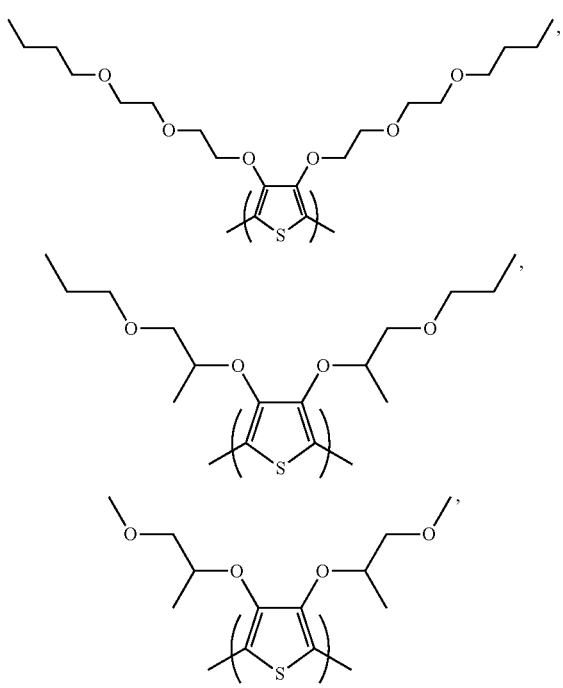

and combinations thereof.

11. The device according to claim 1, wherein the at least one hole carrier material is doped with a dopant.

12. The device according to claim 11, wherein the dopant comprises a tetraarylborate or wherein the dopant comprises tetrakis(pentafluorophenyl)borate or wherein the dopant is silver tetrakis(pentafluorophenyl)borate.

13. The device according to claim 1, wherein the at least one fluoropolymer is the partially fluorinated copolymer.

14. The device according to claim 13, wherein the copolymer is a copolymer of vinylidene fluoride with at least one monomer selected from the group consisting of trifluoroethylene, tetrafluoroethylene, pentafluoropropene, 3,3,3-trifluoropropene, hexafluoropropylene, and chlorotrifluoroethylene.

15. The device according to claim 13, wherein the PVDF copolymer comprises repeating units derived from vinylidene fluoride in an amount of greater than 70% by weight of the copolymer.

16. The device according to claim 13, wherein the PVDF copolymer does not comprise -OM, —SO$_3$M, and/or CO$_2$M, wherein M is H$^+$, an alkali metal ion, or ammonium ion.

17. The device according to claim 13, wherein the copolymer does not comprise sulfonimide, phosphonic acid, and/or phosphoric acid groups.

18. The device according to claim 1, wherein the composition further comprising one or more matrix materials.

19. The device according to claim 1, wherein the device comprises the hole injection layer comprising the composition comprising: (a) at least one hole carrier material, and (b) at least one fluoropolymer which is a partially fluorinated homopolymer or copolymer comprising repeating units derived from vinylidene fluoride monomer.

* * * * *